US 011986899B2

United States Patent
Endreß et al.

(10) Patent No.: US 11,986,899 B2
(45) Date of Patent: May 21, 2024

(54) SOLDERING APPARATUS

(71) Applicant: ERSA GmbH, Wertheim (DE)

(72) Inventors: Lothar Endreß, Wertheim (DE); Benedict Fleischmann, Neubrunn (DE); Lukas Thanhäuser, Würzburg (DE)

(73) Assignee: ERSA GmbH, Wertheim (DE)

( * ) Notice: Subject to any disclaimer, the term of this patent is extended or adjusted under 35 U.S.C. 154(b) by 0 days.

(21) Appl. No.: 17/983,447

(22) Filed: Nov. 9, 2022

(65) Prior Publication Data

US 2023/0141430 A1  May 11, 2023

(30) Foreign Application Priority Data

Nov. 9, 2021 (DE) ..................... 10 2021 129 131.3

(51) Int. Cl.
*B23K 1/00* (2006.01)
*B23K 1/012* (2006.01)
*H05K 3/34* (2006.01)

(52) U.S. Cl.
CPC ........... *B23K 1/012* (2013.01); *H05K 3/3494* (2013.01)

(58) Field of Classification Search
CPC ........ B23K 1/008; B23K 3/08; B23K 1/0016; B23K 1/012
See application file for complete search history.

(56) References Cited

U.S. PATENT DOCUMENTS

| 4,776,105 A * | 10/1988 | Mishina ................. | B23K 1/015 |
| | | | 34/242 |
| 5,467,912 A * | 11/1995 | Mishina ................. | B23K 1/012 |
| | | | 228/8 |
| 6,084,214 A * | 7/2000 | Tallman ................. | B23K 1/012 |
| | | | 219/400 |

(Continued)

FOREIGN PATENT DOCUMENTS

| CN | 201167453 Y | 12/2008 |
| DE | 102005055283 A1 | 5/2007 |

(Continued)

OTHER PUBLICATIONS

Non-translated German Office Action, dated Dec. 12, 2022. pp. 1-4.

*Primary Examiner* — Erin B Saad
(74) *Attorney, Agent, or Firm* — George R. McGuire (57) ABSTRACT

A soldering apparatus, in particular a reflow soldering apparatus, for continuous soldering of printed circuit boards along a transport direction, having a process channel that includes a preheating zone, a soldering zone and a cooling zone, having a base body and a cover hood movable between a closed position and an open position, wherein nozzle plates, fan units with fan motors, air channels carrying the process gas, filter elements and/or cooling elements are provided in the base body. At least one fan unit is arranged in or on the base body laterally next to the process channel in the transport direction, and air channels are arranged and provided in such a manner that process gas is blown into the process channel during operation of the at least one fan unit, with the process gas directed through a filter element provided in a filter region after passing through the process channel, and the filtered process gas drawn in by the at least one fan unit.

14 Claims, 6 Drawing Sheets

(56) References Cited

U.S. PATENT DOCUMENTS

| | | | |
|---|---|---|---|
| 2008/0061116 A1* | 3/2008 | Bell | H05K 3/3494 228/46 |
| 2008/0295686 A1* | 12/2008 | Neiderman | B23K 1/018 228/18 |
| 2011/0039219 A1* | 2/2011 | Kressmann | B23K 1/008 432/77 |
| 2011/0073637 A1* | 3/2011 | Vincent | B23K 1/0016 228/19 |
| 2012/0178039 A1* | 7/2012 | Kagaya | B23K 3/08 165/177 |
| 2015/0208515 A1* | 7/2015 | Dautenhahn | B01D 53/002 228/6.2 |
| 2018/0333796 A1* | 11/2018 | Diepstraten | B23K 1/20 |
| 2022/0295643 A1* | 9/2022 | Huhler | B23K 1/015 |

FOREIGN PATENT DOCUMENTS

| | | |
|---|---|---|
| DE | 102019125981 A1 | 4/2021 |
| DE | 102019128780 A1 | 4/2021 |
| EP | 1023136 B1 | 3/2004 |
| EP | 3096915 B1 | 1/2020 |

\* cited by examiner

SOLDERING APPARATUS

CROSS REFERENCE TO RELATED APPLICATION

The present application relates and claims priority to German Patent Application No. 10 2021 129 131.3, filed Nov. 9, 2021, the entirety of which is hereby incorporated by reference.

BACKGROUND

The invention relates to a soldering apparatus, in particular a reflow soldering apparatus, for continuous soldering of printed circuit boards along a transport direction, having a process channel that comprises a preheating zone, a soldering zone and a cooling zone, having a base body and a cover hood, which can be displaced between a closed position and an open position, wherein nozzle plates, fan units, air channels carrying the process gas, filter elements and/or cooling elements are provided in the base body.

Reflow soldering apparatuses are used to solder so-called SMD (surface-mounted devices) components onto the surface of printed circuit boards using solder paste. The solder paste, which is in particular a mixture of solder metal granules, soldering flux and pasty constituents, is applied or printed onto the surface of the printed circuit boards for reflow soldering. The components to be soldered are then placed in the solder paste. In the reflow soldering process, the soldering material, i.e. the assembly consisting of printed circuit board, solder paste and components to be soldered, is, along the process channel, preheated in a preheating zone and heated in a soldering zone to a temperature that is above the melting point of the solder paste. This causes the solder paste to melt and the solder joints to form. In a cooling zone—if one is available—the soldering material is cooled until the molten solder solidifies, before it is removed from the reflow soldering apparatus.

Soldering apparatuses for continuous soldering of printed circuit boards are known from DE 10 2019 128 780 A1, DE 10 2019 125 981 A1 and DE 10 2005 055 283 A1.

In reflow soldering apparatuses, the process channel is usually formed by two channel halves, an upper and a lower channel half. The lower channel half is provided in or on the base body, and the upper channel half is provided in or on the cover hood. In or on the process channel or in or on the base body and in or on the cover hood, further structural elements, such as nozzle plates, fan units, air channels carrying the process gas, filter elements and/or cooling elements, are usually provided. Overall, a desired temperature profile is thus provided along the transport direction in the process channel, wherein the process gas is blown into the process channel, extracted from it, cooled in the cooling zone in particular, cleaned and fed back into the process channel.

From machines of the applicant with the designation HotFlow 3 or Hotflow 4, it is known to provide fan units on the base body vertically below the process channel and to blow process gas from the fan units vertically upwards through a nozzle plate into the process channel. In this case, it has been found that condensate forming in the cooling zone collects on the fan units and contaminates them, resulting in an amount of maintenance that is not inconsiderable.

SUMMARY OF THE INVENTION

The invention is based on the object of providing a soldering apparatus with which, in particular, the cooling zone is advantageously designed in such a manner that contamination is avoided.

This object is achieved by a soldering apparatus. Consequently, it is provided in particular that at least one fan unit is arranged in or on the base body laterally next to the process channel in the transport direction, and that air channels are arranged and provided in such a manner that process gas is blown into the process channel during operation of the at least one fan unit, that the process gas is directed through a filter element after passing through the process channel, and that the filtered process gas is drawn in by the at least one fan unit.

The provision of the at least one fan unit laterally next to the process channel in the transport direction, and not vertically below the process channel, has the advantage that the overall height of the soldering apparatus is reduced, the process channel can be arranged correspondingly lower, and the fan units are easily accessible for repair and maintenance. In addition, better heat dissipation of the heat generated by the fan units is possible, since the heat generated by the fan units can be dissipated laterally next to the process channel. This improves the cooling of the fan motors and increases their service life. Nevertheless, a closed air circuit that is substantially transverse to the transport direction can be provided.

It is advantageous if the at least one fan unit is not only arranged laterally next to the process channel, but also in a plane below the process channel, and that air channels are arranged and provided in such a manner that, during operation of the at least one fan unit, process gas is blown by the at least one fan unit laterally below the process channel and is deflected there vertically upwards into the process channel. Precisely because the preferably multiple fan units are provided on the one hand laterally next to the process channel and on the other hand below the process channel, air can be guided substantially in a straight line along a plane into the region below the process channel.

In addition, it is advantageous if the at least one fan unit comprises a fan motor, a rotor shaft and a fan wheel provided on the rotor shaft, wherein the rotor shaft is arranged transversely to the transport direction and in a manner running in the vertical direction, spaced laterally from the process channel, wherein the fan motor is arranged vertically above the fan wheel. Such a design has the advantage that contaminants do not collect in the fan motor. Even if contaminants or condensate should accumulate or collect on the fan wheel or rotor shaft, they will not enter the fan motor. Since the fan motor is arranged vertically above the fan wheel, contaminants and condensate are deposited underneath the fan wheel as a result of gravity, in particular when the fan units are switched off. This saves maintenance expense, reduces wear on the fan motors and extends the service life of the fan units.

Furthermore, it is advantageous if the at least one fan unit is arranged and the fan wheel is formed in such a manner that process gas is drawn in axially on the intake region facing away from the fan motor and is blown in the radial direction. Consequently, process gas is drawn in from vertically below and discharged laterally in a horizontal direction.

A plurality of fan units is preferably provided for the targeted movement of the process gas in the base body, wherein at least one shielding plate is provided axially below the intake region, which shielding plate shields the intake region of the at least one fan unit from the filter region. This ensures that process gas does not flow directly from the filter element to the fan unit but is deflected via the respective shielding plate.

Furthermore, it is advantageous if a guide channel is provided laterally next to the at least one fan unit in the transport direction at the level of the fan wheel and below the process channel, such that the process gas coming from the at least one fan unit is initially blown laterally below the process channel and is then guided vertically upwards into the process channel. During operation of the at least one fan unit, process gas is thus blown into the process channel in the cooling zone in such a manner that the soldering material is blown on from below.

It is also advantageous if a plurality of fan units is provided one behind the other along a line parallel to the transport direction, the rotor shafts of which are formed to run parallel to one another. Such an arrangement can be used to create an air circuit that extends in the transport direction, wherein the main directions of air flow are transverse to the transport direction.

Furthermore, it is conceivable that the cover hood can be pivoted about a hood axis between the closed position and the open position and that the at least one fan unit is provided in a transverse direction running transversely to the transport direction between the hood axis and the process channel, such that the at least one fan unit is provided on the side of the process channel located close to the hood axis. This has the advantage that the at least one fan unit is not in the way of operating personnel when opening the hood and working in the process channel. Consequently, access to the process channel when the cover hood is opened is not disturbed by the provision of the at least one and preferably more fan units.

Furthermore, it is advantageous if air channels and a cooling element, in particular in the form of a heat exchanger, are provided in such a manner that process gas, before being blown into the process channel, passes through the cooling element and then enters the process channel through a nozzle plate. When passing through the cooling element, the process gas can be cooled down further. By providing the nozzle plate, a comparatively uniform and ideally laminar flow can be provided within the process channel.

Furthermore, it is advantageous if, in particular, air channels and a cooling device are provided in the cooling zone in such a manner that the process gas is guided along the cooling device comprising a cooling plate after passing through the process channel and before passing through the filter element. This ensures that moisture and vapors absorbed by the process gas when passing through the cooling plate can condense on the cooling plate before the process gas is directed through the filter element.

It is also advantageous if the cooling plate runs along a cooling plane that runs obliquely to the horizontal line and has a drip tray in its vertically lower region. This allows liquid condensing on the cooling plate to be collected in the drip tray following the slope of the cooling plate. Furthermore, the drip tray is transparent, in particular, such that it is possible to visually check whether and how much condensate is present in the drip tray. The drip tray is further preferably detachably arranged such that the emptying of the drip tray is possible in a simple manner.

Furthermore, it is advantageous if the filter element in the cooling zone runs along a filter plane that runs obliquely to the horizontal line. The oblique arrangement of the filter plane allows its surface area to be increased compared to a horizontal arrangement, thus increasing the filter capacity. In addition, moisture collecting in the filter element can drip off better. The filter element can comprise a filter grid and a filter fleece provided in or on the filter grid.

It is particularly advantageous if the cooling plane and the filter plane enclose an acute angle. This results in optimized air guidance and an overall optimized cooling result and filtering result of the process gas.

Furthermore, it can be provided that air channels are formed and arranged in such a manner that the process gas is discharged vertically downwards from the process channel on the side facing away from the at least one fan unit via an insertion channel and is deflected toward the cooling plate.

Furthermore, it is advantageous if a drawer, which can be pulled out along a pull-out direction running transversely to the transport direction and has a bottom, a front wall and a rear side, which in particular can be formed by a rear wall or can comprise a rear wall, is provided in the base body in the cooling zone, wherein air channels for guiding the process gas, at least one filter element and at least one cooling device are provided in the drawer. By providing the drawer that can be pulled out transversely to the transport direction and in particular in the vertical direction, the at least one replaceable filter element and the cooling device provided in the drawer are consequently easily accessible. Since vapors contained in the process gas condense at the cooling device, it is particularly advantageous by providing the drawer to collect the condensate in the drawer and, if necessary, to ultimately remove it by opening the drawer. Further, the provision of the drawer is advantageous for visually inspecting and/or replacing the filter element. Replacing the filter element when the drawer is opened is comparatively easy.

BRIEF DESCRIPTION OF THE DRAWINGS

Further details and advantageous embodiments of the invention can be found in the following description, by means of which an exemplary embodiment of the invention is described and explained.

DETAILED DESCRIPTION

Figure 1:
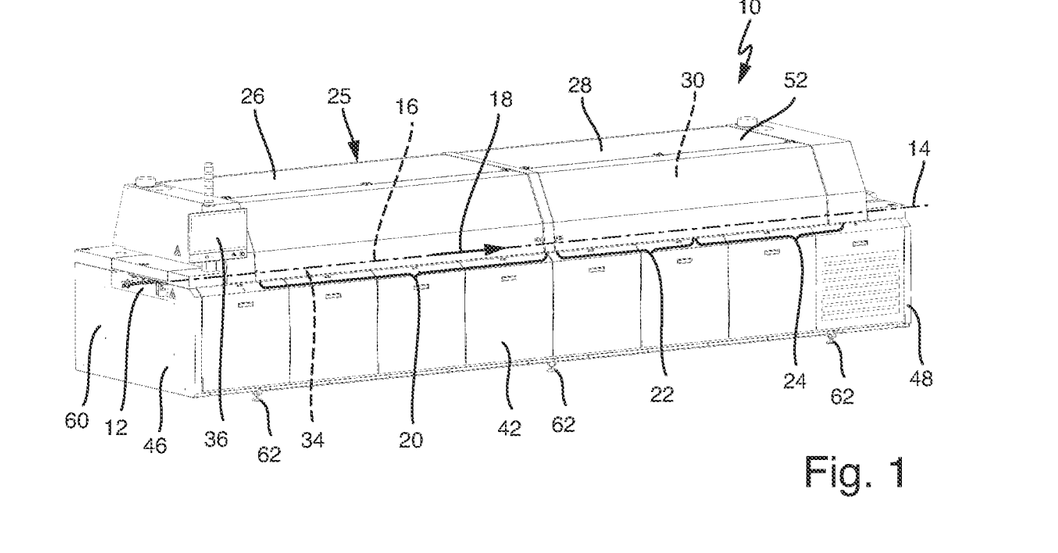
FIG. 1 shows a side view of a reflow soldering apparatus from an angle at the front with the cover hood closed.

FIG. 1 shows a reflow soldering apparatus 10 for the continuous soldering of soldering material. The reflow soldering apparatus 10 has an inlet 12 and an outlet 14, wherein the soldering material to be soldered enters the reflow soldering apparatus 10 via the inlet 12 and is discharged from the reflow soldering apparatus 10 via the outlet 14. The soldering material is transported along a transport direction 18 through a process channel 16 indicated in FIG. 1. A preheating zone 20, a soldering zone 22 and a cooling zone 24 are provided in the process channel 16.

Figure 2:
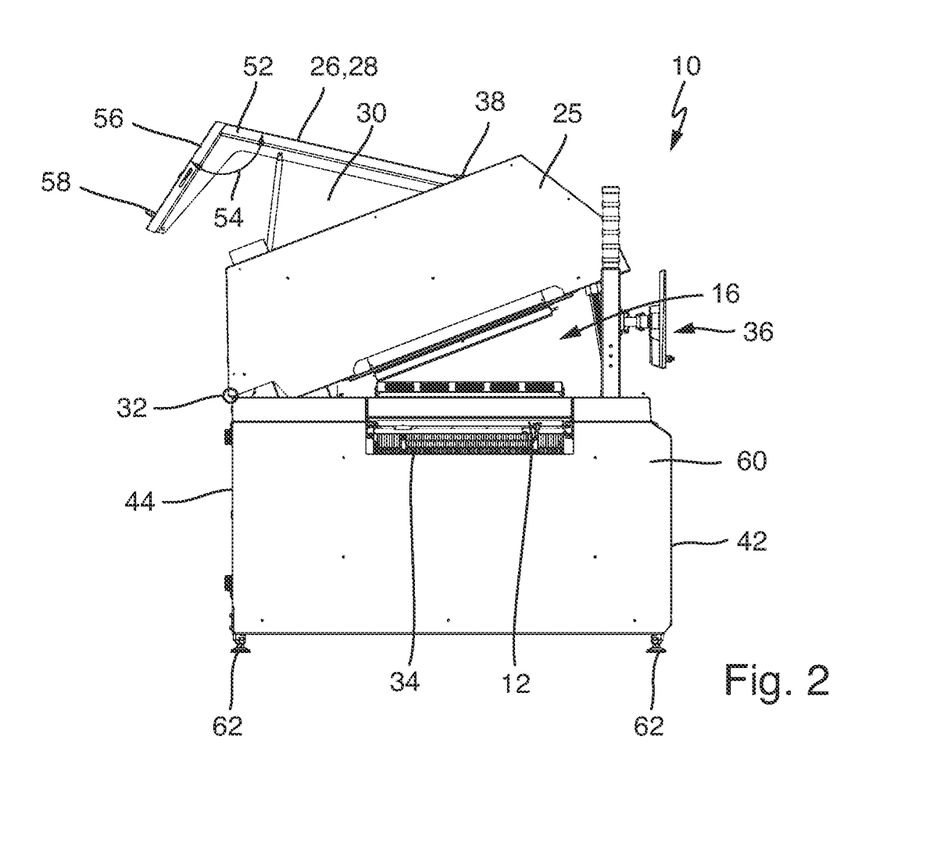
FIG. 2 shows a front view of the reflow soldering apparatus according to FIG. 1 with the cover hood open and the hood flaps open.

As can be seen from FIGS. 1 and 2, a communication unit 36 with a display screen and an input device is provided, by means of which communication can be established with a machine control system of the reflow soldering apparatus 10.

The soldering material, i.e., the printed circuit board provided with solder paste and fitted with electronic components, is initially heated in the preheating zone 20, to a temperature below the melting temperature of the solder paste. In the soldering zone 22, the printed circuit board is heated to a process temperature above the melting point of the solder paste for a specified period of time, such that the paste melts in the soldering zone in order to solder the electronic components to the printed circuit board. In the cooling zone 24, the soldering material is cooled such that the liquid solder solidifies before the soldering material is removed at the outlet 14 of the reflow soldering apparatus 10.

A transport system 34 is provided within the reflow soldering apparatus 10 for transporting the printed circuit boards along the transport direction 18.

As can be seen from FIG. 2, the reflow soldering apparatus 10 has a cover hood 25 with two hood flaps 26, 28. The cover hood 25 can be swung open about a hood axis 32 extending parallel to the transport direction 18. Swinging open the cover hood 25 provides access to the interior of the process channel 16 and the transport system 34 for visual inspection, maintenance, cleaning, setup, replacement and repair as necessary.

As can be seen further from FIG. 2, the hood flaps 26, 28 can be swung open about a flap axis 38 running parallel to the hood axis 32. By swinging open the hood flaps 26, 28, the hood space 30 located above the process channel and thus above the upper channel half becomes accessible by providing fan modules, heating elements and air channels. The flap axis 38 is arranged above the hood axis 32, not only when the cover hood 25 is opened, but also when the cover hood 25 is closed.

The soldering apparatus 10 has two longitudinal sides 42 and 44 and two narrow sides 46 and 48. As can be readily seen in FIG. 2, the hood axis 32 is located in the region of one rear longitudinal side 44. In contrast, the flap axis 38 is located in the region of the front longitudinal side 42 or is closer to the front longitudinal side 42 than to the rear longitudinal side 44.

Figure 3:
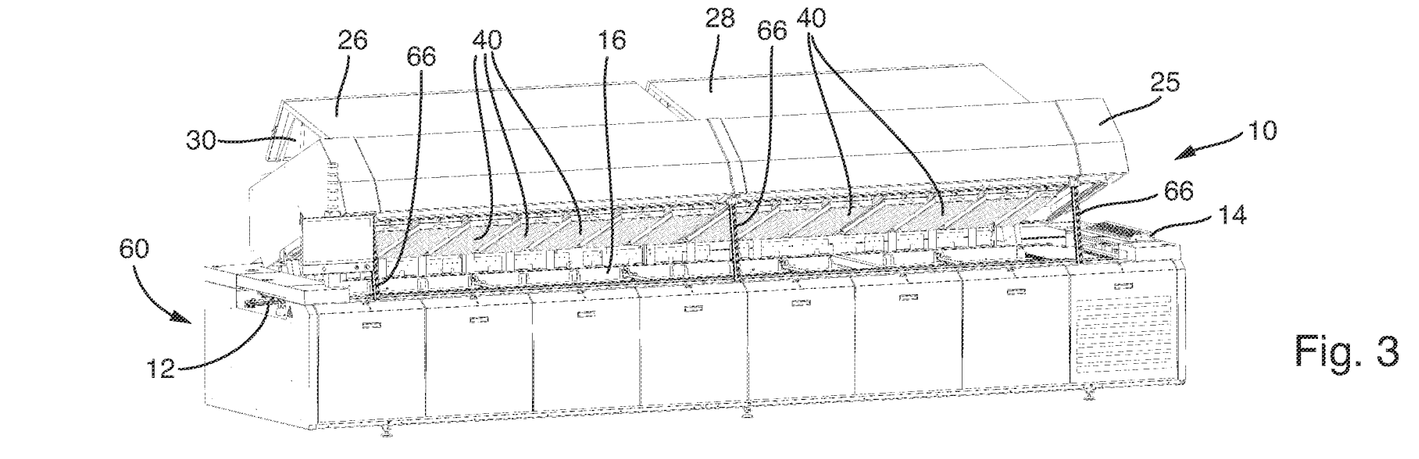
FIG. 3 shows the reflow soldering apparatus according to FIG. 1 from an angle at the front with the cover hood open and the hood flaps open.

In FIG. 3, in which on the one hand the cover hood 25 and on the other hand the hood flaps 26, 28 are open, the open process channel 16 can be seen in particular. The process channel 16 is formed by two channel halves, an upper channel half and a lower channel half. The lower channel half with the lower nozzle plates 118 is provided in or on a base body 60, and the upper channel half with the upper nozzle plates 40 is provided in or on the cover hood 25. The upper channel half and upper nozzle plates 40 and other components located in the hood space 30 are arranged on the cover hood 25 in such a manner that they are also swung open when the cover hood 25 is opened, and the process channel 16 is released.

Figure 4:
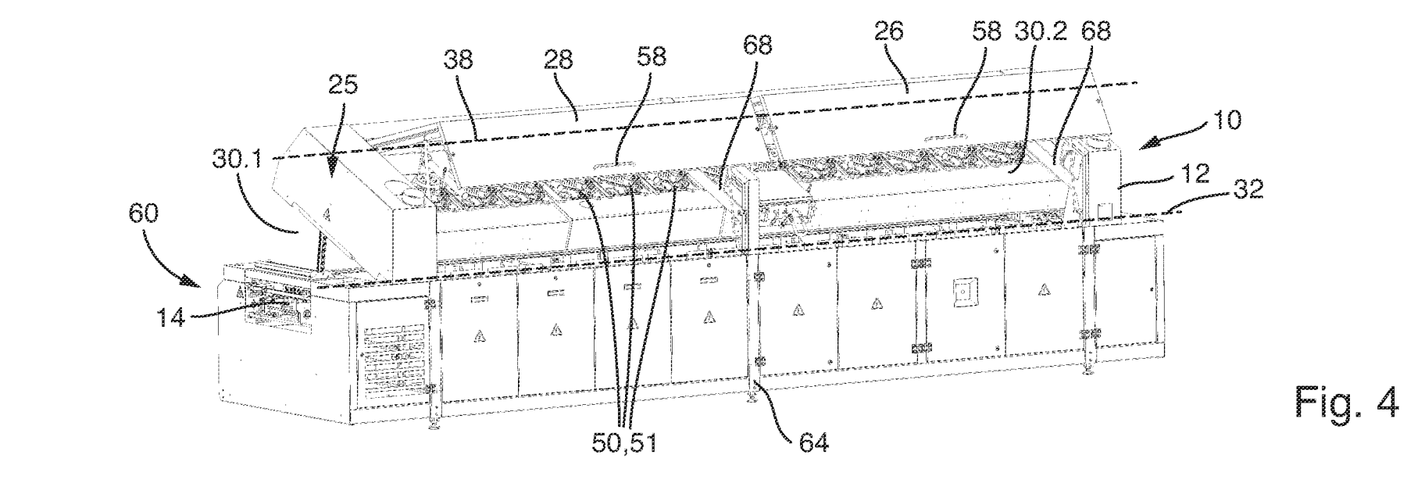
FIG. 4 shows the reflow soldering apparatus according to FIG. 1 from an angle at the rear with the cover hood open and the hood flaps open.

Such an arrangement ensures that, as is clear from FIGS. 2 to 4, the process channel 16 is accessible from the front longitudinal side 42 when the cover hood 25 is opened and that the upper hood space 30 covered by the hood flaps 26, 28 is accessible from the other, rear longitudinal side 44. Among other things, this has the advantage that when the cover hood 25 is opened, and thus when the process channel 16 is exposed, gas flowing out of the process channel 16 does not flow into the upper hood space 30 covered by the cover flaps 26, 28. Further, a plurality of operators can simultaneously inspect or maintain, on the one hand, the process channel 16 and, independently, the hood space 30 covered by the cover flaps 26, 28.

Figure 5:
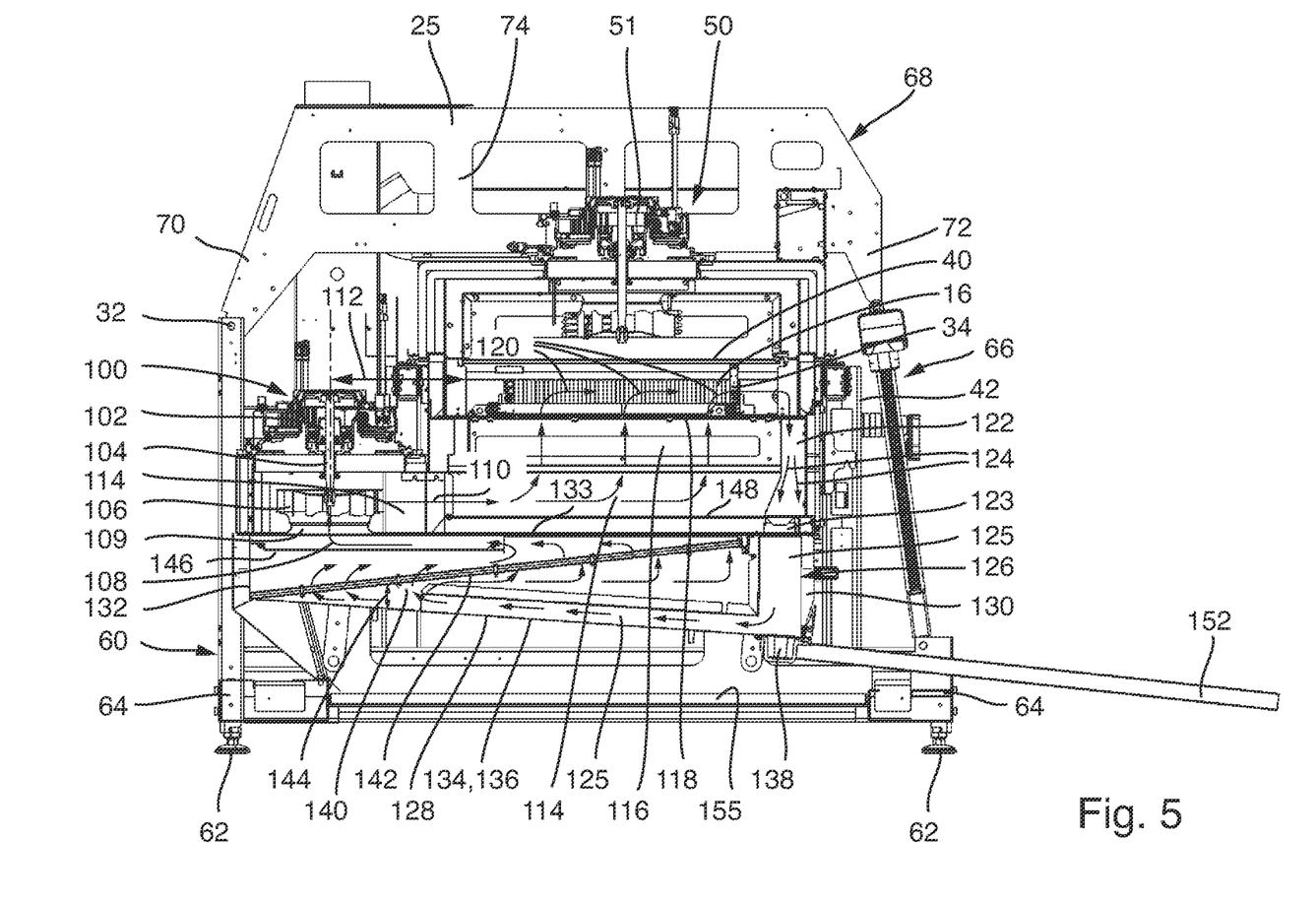
FIG. 5 shows a cross-section through the cooling zone of the reflow soldering apparatus according to FIG. 1 without cladding with the drawer closed.

As can be seen from FIGS. 4 and 5, a plurality of fan units 50 with fan motors 51 are located above the upper channel half in the hood space 30 covered by the hood flaps 26, 28 and are provided to generate a provided air flow in the process channel 16. The fan units 50 in the preheating zone 20 and the process zone 22 may additionally have heating elements in order to provide a predetermined temperature. By means of the fan units 50 or their fan motors 51, suitably heated or also cooled process gas is introduced from above through the nozzle plates 40 into the process channel 16 and then drawn in again via the longitudinal sides of the process channel 16.

Consequently, if the cover hood 25 is opened, the process channel 16 in particular and the transport system provided therein are accessible. If the hood flaps 26, 28 are opened, in particular the fan units 50 provided therein with their heating elements, if any, and air channels likewise provided therein are accessible.

In their closed position, shown in FIG. 1, the two hood flaps 26, 28 have a horizontal section 52 located close to the flap axis 38 and extending in a substantially horizontal direction. This horizontal section 52 is adjoined by an oblique section 56 that is remote from the flap axis 38 and forms an obtuse angle 54 with the horizontal section 52. Handles 58 for opening the two hood flaps 26, 28 are provided on the oblique section, as is particularly clear from FIG. 4. The obtuse angle 54 can be seen clearly, in particular in FIG. 2.

The base body 60 stands on a floor by means of feet 62. The feet 62 are provided on a lower frame 64. Furthermore, drive units 66 for motorized opening and closing of the cover hood 25 are provided, which are supported on the lower frame 64 at one end and on the cover hood 25 at the other end. As is also clear from FIG. 5, which shows the cover hood 25 without cladding, the cover hood 25 comprises gantry-like frame legs 68, each of which has a first support section 70 directed toward the hood axis 32 and a second support section 72 directed toward the respective drive unit 66. A center section 74 is provided between each of the two support sections 72.

Figure 6:
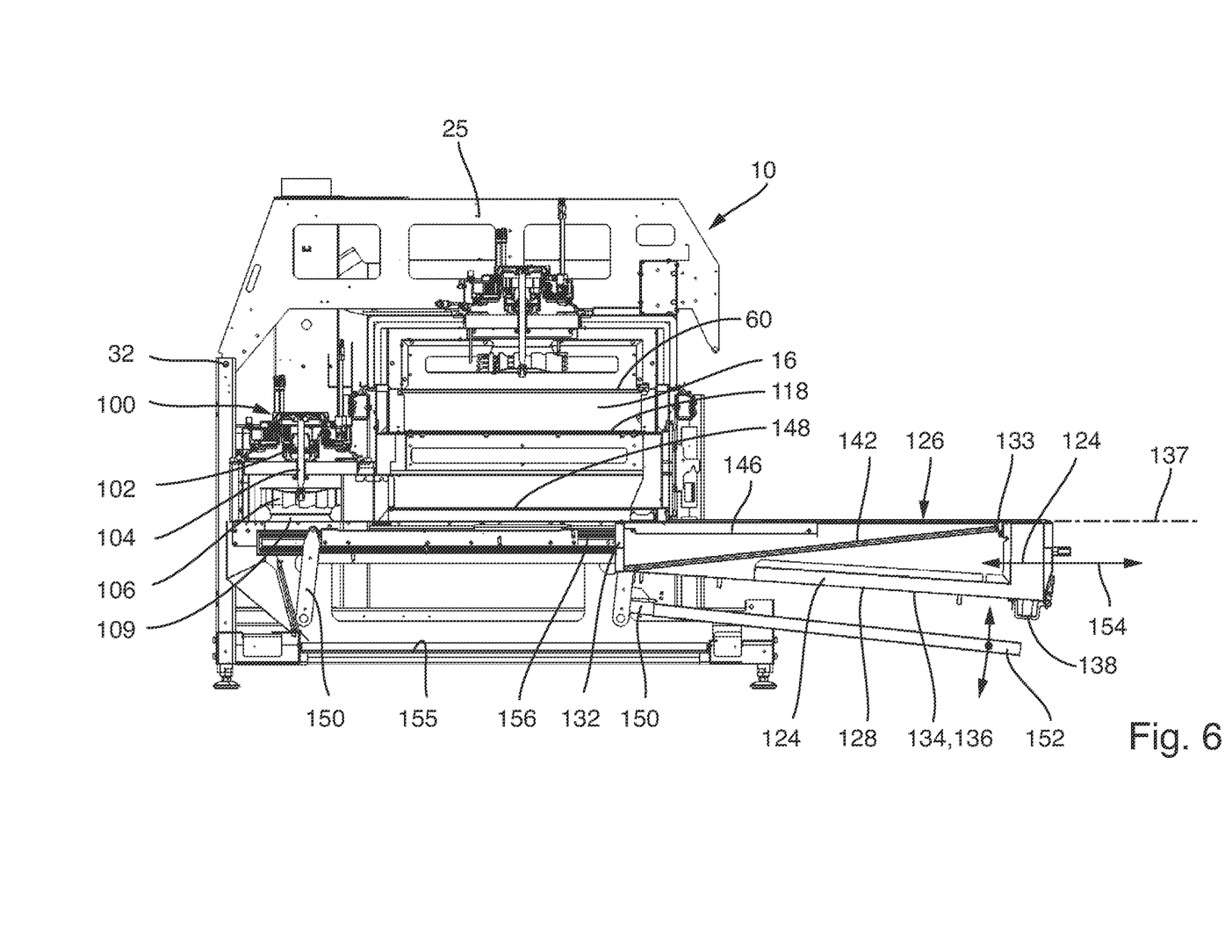
FIG. 6 shows a cross-section through the reflow soldering apparatus according to FIG. 1 with the drawer open.

As can be seen from the sectional view through the cooling zone 24 according to FIG. 5, a plurality of fan units 100 arranged behind one another in the transport direction 18 is provided in the base body 60 laterally next to the process channel 16 in the transport direction 18 and in a plane below the transport channel 18, wherein only one fan unit 100 can be seen in each case in the sectional view according to FIGS. 5 and 6. The fan units 100 correspond in structure to the fan units 50 and, as can be seen from FIGS. 5 and 6, are located in the transverse direction between the hood axis 32 and the process channel 16.

The fan units 100 each have a fan motor 102, a rotor shaft 104 driven by the fan motor 102 and a fan wheel 106 provided on the rotor shaft 104. The respective fan wheel 106 is a radial fan wheel that, in FIG. 5, draws in process gas 108 axially from below from an intake region 109 and that blows away process gas 110 in the radial direction. The respective rotor shaft 104 is laterally spaced from the process channel 16 in the horizontal direction by the dimension 112, as is clear from FIG. 5. The respective rotor shaft 104 runs in a vertical direction. The arrangement is such that the respective fan motor 102 sits vertically above the respective fan wheel 106.

During operation of the fan units 100, process gas 110 is blown into a substantially horizontally running guide channel 114, which runs adjacent to the fan wheel 106 in a transverse direction running transversely to the transport direction 18, initially laterally next to and then vertically below the process channel 16. The process gas is then blown in vertically upwards through the guide channel 114, through a cooling element in the form of a heat exchanger 116, in which the process gas is further cooled, and through a lower nozzle plate 118 from below into the process channel 16. Consequently, the soldering material to be cooled is blown on from below within the cooling zone 24.

At the solder material provided in the process channel 14, the process gas 120 blown in is directed toward the front longitudinal side 42. There, the process gas 124 enters an insertion channel 122 and is directed vertically downwards. In the region 123, the insertion channel 122 provided on the base body 60 merges into an input channel 125 that is provided in a drawer 126. The drawer 126 is shown closed in FIG. 5 and open in FIG. 6. Moreover, the drawer 126 is shown as a single part in FIGS. 8 and 9. The drawer 126 is accessible from the front side 42 of the base body 60. Openable doors are provided on the front side of the base body 60 shown in FIG. 3, behind which doors the drawer 126 is provided.

Figure 8:
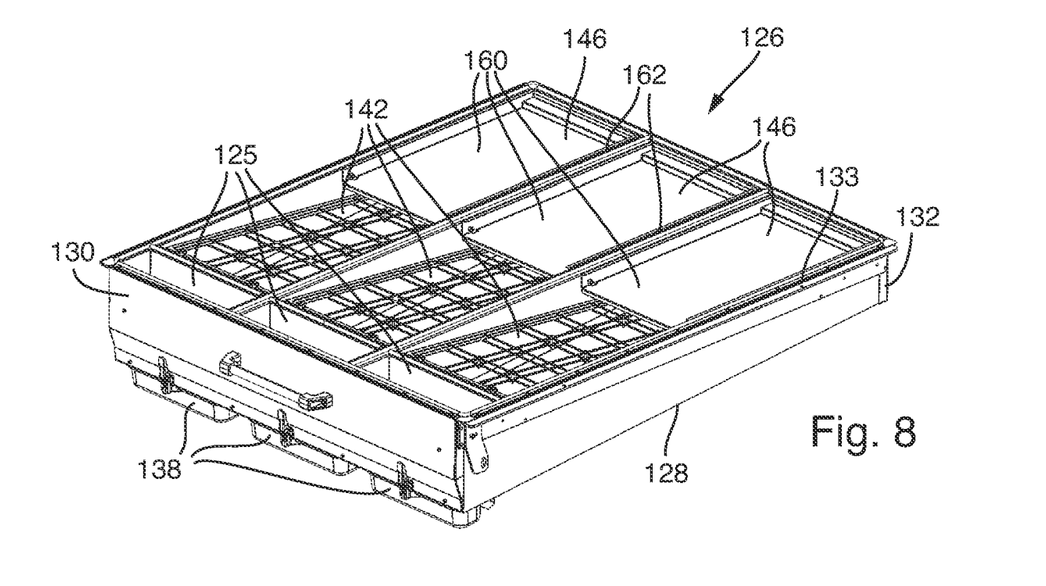
FIG. 8 shows a drawer of the reflow soldering apparatus according to FIGS. 6 and 7.
Figure 9:
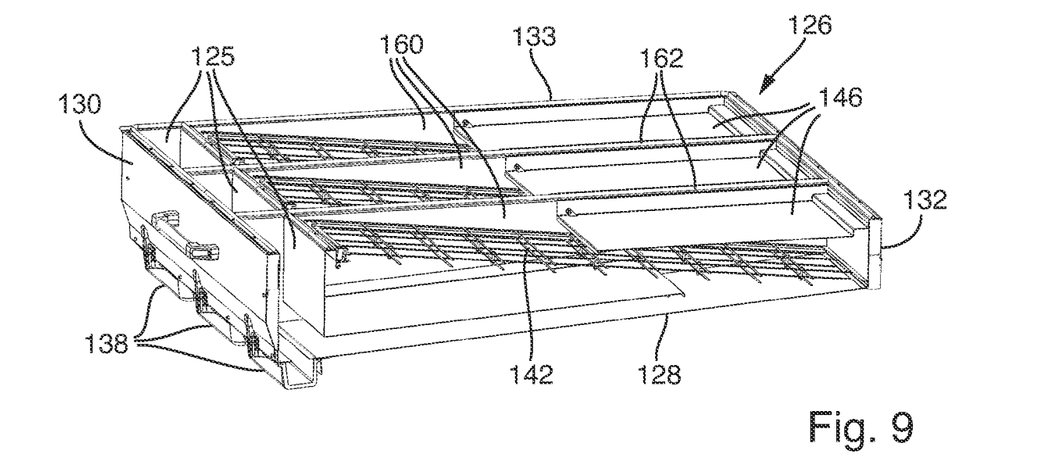
FIG. 9 shows a longitudinal section through the drawer according to FIG. 8.

The drawer 126 looks on a bottom 128, a front wall 130 and a rear side in the form of a rear wall 132. The drawer 126 also has an upper edge 133 that is formed to run horizontally. The inlet channel 125 directs process gas in the region of the bottom 128 toward a cooling device 136 formed as a cooling plate 134.

As can be seen in particular from FIGS. 5 and 6, the cooling plate 134 runs obliquely to the upper edge 133 or to the horizontal line 137 and slopes down forward, i.e. toward the front longitudinal side 42 or toward the front wall 130 of the drawer 126. A removable drip tray 138 is provided on the bottom 128 of the drawer 126 in the region of the front wall 130. Condensate that condenses on the cooling plate 134 collects in the drip tray 138. In the present embodiment, the cooling plate 134 is cooled by ambient air. However, it is conceivable that active cooling elements, for example a heat exchanger or a cooling element that can be supplied with power, are provided in the region of the cooling plate 134, in order to achieve a higher cooling capacity.

In particular, the removable and emptiable drip tray 138 is formed to be translucent, such that the fill level of the drip tray 138 can be visually inspected.

The inlet channel 125 opens into a filter region 140 on the side facing away from the front wall 130 and facing the rear wall 132. A filter element 142 is provided in the filter region 140. As can also be seen in particular from FIGS. 5 and 6, the filter element 142, which can for example provide a filter grid with a filter fleece, runs obliquely to the horizontal line 137 and is formed to slope down toward the rear wall 132. The filter element 142 then lies in a diagonal line of the drawer 126. Overall, the plane in which the cooling plate 134 lies and the plane formed by the filter element 142 enclose an acute angle 144.

The drawer 126 has a shielding plate 146 in the rear region above the filter element 142. As can be seen from FIG. 5, the shielding plate 146 is provided between the intake region 109 of the fan wheel 106 and the filter element 142 and consequently shields the intake region 109 of the fan wheel 106. In particular, the shielding plate 146 shields the region of the filter element 142 that is close to the bottom 128 of the drawer 126. The provision of the shielding plate 146 consequently means that not the entire upper side of the drawer 126 is open, but rather only the region that is not covered by the shielding plate 146 is open. This results in a favorable air deflection and also a more uniform passage of the process gas through the filter element 142.

To cause the process gas passing through the filter element 142 to be directed toward the intake region of the respective fan unit 100, a guide plate 148 is provided on the base body 60.

In FIG. 5 and FIG. 6, the drawer 126 is shown in a slightly vertically lowered condition. To raise the drawer 126, a lowering mechanism 150 with a lever gear is used, which can be operated via a manually operated rod 152, with which the drawer 126 can be adjusted between a lowering position and a lifting position. In particular, it is conceivable that the lowering mechanism 150 and the drawer 126 are provided behind a door provided at the front side of the base body 60, such that the lowering mechanism 150 and the drawer 126 are accessible after opening the door. After the drawer 126 has been lowered, it can be pulled out transversely to the transport direction 18, in a horizontally running pull-out direction 154, as shown in FIG. 6. For this purpose, a horizontal guide 156 in the form of a guide rail for the drawer 126 is shown in FIG. 6.

Of course, it is also conceivable that the lowering mechanism 150 is operated automatically, for example electrically or pneumatically.

A collection tray 155 is provided in the base body 60 below the drawer 126, which collection tray serves to collect dripping condensate or falling contaminants when the drawer 126 is opened.

Figure 7:
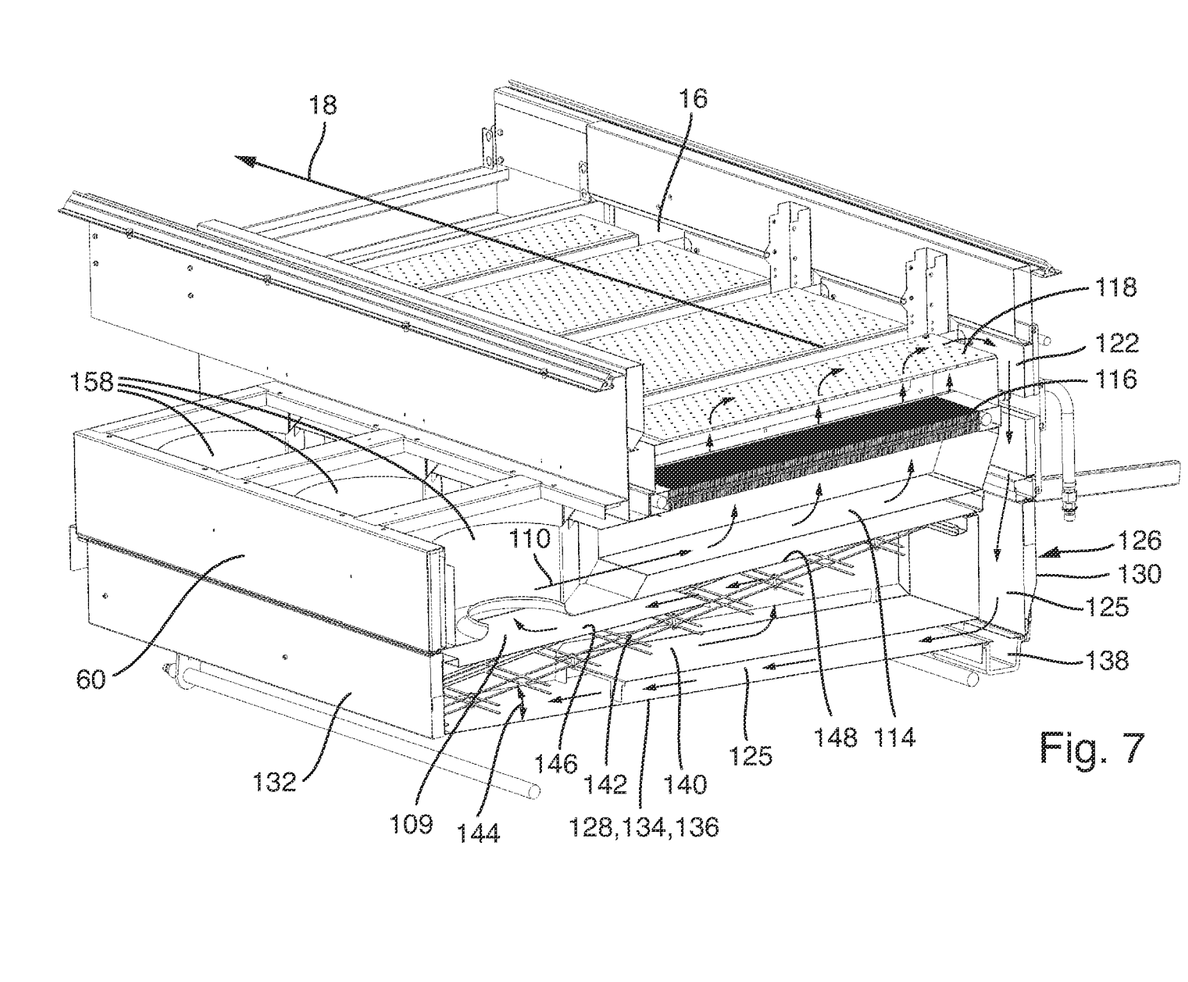
FIG. 7 shows a section of the base body of the reflow soldering apparatus with a drawer according to FIGS. 6 and 7 in an illustration of a single part.

FIG. 7 shows three fan receptacles 158 for receiving fan units 100, which are not shown there. The fan receptacles 158 are provided laterally next to the process channel 16 and spaced horizontally with respect to the process channel 16, such that fan units 100 inserted into the fan receptacles 158 are arranged along a line that runs parallel to the transport direction 18. The rotor shafts 104 of these fan units 100 are then arranged to run parallel to one another.

The fan units 100 to be provided in the three fan receptacles 158 provide a total of three air circuits running transversely to the process direction 118, wherein the drawer 126, as shown in FIGS. 8 and 9, has for this purpose three compartments 160 lying next to one another in the pull-out direction 154. The adjacent compartments 160 are separated by compartment walls 162. Each of the compartments 160 in the drawer 126 has its own inlet channel 125, its own filter element 142 and its own shielding plate 146. Consequently, a total of three separate air circuits are provided in the drawer 126, wherein each air circuit is provided by means of a fan unit 100 provided in the respective fan receptacle 158.

The illustration in FIG. 7 once again clearly shows the respective circuit of the process gas. A total of 3 air circuits are provided, which run substantially transversely to the transport direction 18. The air circuit provided by the respective fan unit 100 is such that process gas 110 is initially blown laterally into the guide channel 114 below the process channel via the respective fan unit 100 and is deflected upwards. The process gas then passes through the heat exchanger 116 before entering the process channel 16 through the nozzle plate 118. The soldering material is then preferably flowed against and cooled from below over the entire length of the cooling zone 24. The process gas is extracted from the process channel, via the insertion channel 122 provided at the front side, which insertion channel opens into the respective inlet channel 125 of the drawer 126. The process gas then flows along the bottom 128 or the cooling plate 134 into the respective filter region 140. Condensate contained in the process gas condenses on the cooling plate 134 and collects in the drip tray 138, which can preferably be emptied without opening the drawer 126. The process gas then flows through the respective filter element 142, is deflected at the lower side of the respective shielding plate 146, and is further directed over the upper side of the respective shielding plate 146 toward the respective fan unit 100. Overall, this ensures that all process gas that flows back into the process channel passes through the filter element 142 and is thus cleaned.

As can be seen from FIGS. 8 and 9, the respective shielding plates 146 extend from the rear wall 132 toward the front wall 130 such that they cover approximately half of the filter element 142. In FIGS. 8 and 9, the filter element 142 is formed by a wire mesh shown in FIG. 8, in which a filter fleece (not further shown), which can be replaced in a simple manner, is placed.

What is claimed is:

1. A soldering apparatus for continuous soldering of printed circuit boards along a transport direction, comprising:
   a process channel that comprises a preheating zone, a soldering zone and a cooling zone,
   a base body and a cover hood, which can be displaced between a closed position and an open position, wherein nozzle plates, fan units with fan motors, air channels carrying the process gas, filter elements and cooling elements are provided in the base body, wherein at least one fan unit is arranged in or on the base body laterally next to the process channel in the transport direction and below the process channel,
   wherein the at least one fan unit comprises a fan motor, a rotor shaft and a fan wheel provided on the rotor shaft, wherein the rotor shaft is arranged in a manner running in a vertical direction, laterally next to the process channel, wherein the fan motor is arranged vertically above the fan wheel,
   wherein air channels are arranged and provided in such a manner that, during operation of the at least one fan unit, process gas is blown laterally below the process channel and is deflected there vertically upwards into the process channel, wherein the process gas is directed through a filter element provided in a filter region after passing through the process channel, wherein the filtered process gas is drawn in by the at least one fan unit.

2. The soldering apparatus according to claim 1, wherein the at least one fan unit is arranged and the fan wheel is formed in such a manner that process gas is drawn in axially from an intake region positioned below and facing away from the fan motor and is blown in the radial direction.

3. The soldering apparatus according to claim 1, wherein at least one shielding plate is provided axially below an intake region, which shielding plate shields the intake region of at least one fan unit from the filter region.

4. The soldering apparatus according to claim 1, wherein a guide channel is provided laterally next to the at least one fan unit in the transport direction at the level of the fan wheel and below the process channel, such that the process gas coming from the at least one fan unit is blown from laterally under the process channel and then guided vertically upwards into the process channel.

5. The soldering apparatus according to claim 1, wherein a plurality of fan units is provided one behind the other parallel to the transport direction, wherein their rotor shafts are arranged to run parallel to one another.

6. The soldering apparatus according to claim 1, wherein during operation of the at least one fan unit, process gas is blown into the process channel in such a manner that the soldering material is blown on from below.

7. The soldering apparatus according to claim 1, wherein the cover hood can be pivoted about a hood axis between the closed position and the open position, and in that the at least one fan unit is provided in a transverse direction running transversely to the transport direction between the hood axis and the process channel.

8. The soldering apparatus according to claim 1, wherein air channels and the cooling element are provided in such a manner that the process gas, before being blown into the process channel, passes through the cooling element and then enters the process channel through a nozzle plate.

9. The soldering apparatus according to claim 1, wherein air channels and a cooling device are provided in such a manner that the process gas is guided along the cooling device comprising a cooling plate after passing through the process channel and before passing through the filter element.

10. The soldering apparatus according to claim 8, wherein the cooling plate runs along a cooling plane that runs obliquely to the horizontal line and has a drip tray in its vertically lower region.

11. The soldering apparatus according to claim 1, wherein the filter element runs along a filter plane that runs obliquely to the horizontal line.

12. The soldering apparatus according to claim 10, wherein the cooling plane and the filter plane forms an acute angle.

13. The soldering apparatus according to claim 1, wherein the air channels are formed and arranged in such a manner that the process gas is discharged vertically downwards from the process channel on the side facing away from the at least one fan unit via an insertion channel.

14. The soldering apparatus according to claim 1, wherein a drawer, which can be pulled out along a pull-out direction running transversely to the transport direction and has a bottom, a front wall and a rear side, is provided in the base body, wherein air channels for guiding the process gas, at least the one filter element and at least one cooling device are provided in the drawer.

* * * * *